United States Patent
Sin et al.

(10) Patent No.: US 10,404,286 B2
(45) Date of Patent: Sep. 3, 2019

(54) MEMORY MODULES, MEMORY SYSTEMS INCLUDING THE SAME AND METHODS OF OPERATING MEMORY SYSTEMS

(71) Applicant: SAMSUNG ELECTRONICS CO., LTD., Suwon-si, Gyeonggi-do (KR)

(72) Inventors: Hoon Sin, Suwon-si (KR); Sang-Uhn Cha, Yongin-si (KR); Ye-Sin Ryu, Seoul (KR); Seong-Jin Cho, Hwaseong-si (KR)

(73) Assignee: Samsung Electronics Co., Ltd., Suwon-Si, Gyeonggi-do (KR)

( * ) Notice: Subject to any disclaimer, the term of this patent is extended or adjusted under 35 U.S.C. 154(b) by 33 days.

(21) Appl. No.: 15/664,295

(22) Filed: Jul. 31, 2017

(65) Prior Publication Data

US 2018/0152206 A1 May 31, 2018

(30) Foreign Application Priority Data

Nov. 30, 2016 (KR) .......................... 10-2016-0161528

(51) Int. Cl.
*G06F 11/10* (2006.01)
*H03M 13/29* (2006.01)
*H03M 13/09* (2006.01)
*H03M 13/13* (2006.01)

(52) U.S. Cl.
CPC ..... *H03M 13/2906* (2013.01); *G06F 11/1048* (2013.01); *G06F 11/1076* (2013.01); *H03M 13/09* (2013.01); *H03M 13/13* (2013.01)

(58) Field of Classification Search
CPC .................................................. H03M 13/11

USPC ............................... 714/758, 764, 760, 763
See application file for complete search history.

(56) References Cited

U.S. PATENT DOCUMENTS

| | | |
|---|---|---|
| 6,457,154 B1 | 9/2002 | Chen et al. |
| 7,665,009 B2 | 2/2010 | Kobayashi |
| 7,679,133 B2 | 3/2010 | Son et al. |
| 8,078,938 B2 | 12/2011 | Kawabata |
| 8,553,466 B2 | 10/2013 | Han et al. |
| 8,559,235 B2 | 10/2013 | Yoon et al. |
| 8,566,669 B2 | 10/2013 | Schuette |
| 8,654,587 B2 | 2/2014 | Yoon et al. |
| 9,389,957 B2 | 7/2016 | Suzuki et al. |
| 9,396,064 B2 | 7/2016 | Hoekstra et al. |
| 2011/0233648 A1 | 9/2011 | Seol et al. |
| 2014/0192583 A1* | 7/2014 | Rajan ....................... G11C 7/10 365/63 |
| 2014/0317469 A1* | 10/2014 | Sohn .................... G11C 29/848 714/764 |

(Continued)

*Primary Examiner* — Fritz Alphonse
(74) *Attorney, Agent, or Firm* — Lee & Morse, P.C.

(57) ABSTRACT

A memory module includes data memories and at least one parity memory. Each of the data memories includes a first memory cell array with a first memory region to store data set corresponding to a plurality of burst lengths and a second memory region to store first parity bits to perform error detection/correction associated with the data set. The at least one parity memory includes a second memory cell array with a first parity region to store parity bits associated with user data set corresponding to all of the data set stored in each of the data memories and a second parity region to store second parity bits for error detection/correction associated with the parity bits.

21 Claims, 17 Drawing Sheets

(56) References Cited

U.S. PATENT DOCUMENTS

2014/0317470 A1* 10/2014 Chung ................ G06F 11/1076
714/764
2014/0317471 A1* 10/2014 Ryu ........................ G06F 11/10
714/764
2016/0011940 A1   1/2016 Hu et al.

* cited by examiner

MEMORY MODULES, MEMORY SYSTEMS INCLUDING THE SAME AND METHODS OF OPERATING MEMORY SYSTEMS

CROSS-REFERENCE TO RELATED APPLICATION(S)

Korean Patent Application No. 10-2016-0161528, filed on Nov. 30, 2016, and entitled, "Memory Modules, Memory Systems Including the Same and Methods of Operating Memory Systems," is incorporated by reference herein in its entirety.

BACKGROUND

1. Field

One or more embodiments described herein relate to memory modules, memory systems including memory modules, and a method for operating memory systems.

2. Discussion of the Related Art

In general, a computer system may include a plurality of memory chips (e.g., DRAM) in a memory module form for high performance and large volume. A memory module may be implemented by mounting a plurality of memory chips on a printed circuit board. The memory module may be a single in memory module (hereinafter, referred to as SIMM) and a dual in memory module (hereinafter, referred to as DIMM). The SIMM may include a plurality of memory chips mounted on one side of a printed circuit board, and the DIMM may include a plurality of memory chips mounted on both sides of the printed circuit board.

SUMMARY

In accordance with one or more embodiments, a memory module includes a plurality of data memories; and at least one parity memory, wherein: each of the data memories includes a first memory cell array that includes a first memory region to store a data set corresponding to a plurality of burst lengths and a second memory region to store first parity bits to perform error detection/correction associated with the data set, the at least one parity memory includes a second memory cell array that includes a first parity region to store parity bits associated with a user data set corresponding to all of the data set stored in each of the data memories and a second parity region to store second parity bits for error detection/correction associated with the parity bits.

In accordance with one or more other embodiments, a memory system includes a memory module including a plurality of data memories and at least one parity memory; and a memory controller to control the memory module, wherein: each of the plurality of data memories includes a first memory cell array that includes a first memory region to store data set corresponding to a plurality of burst lengths and a second memory region to store first parity bits to perform error detection/correction, associated with the data set, the at least one parity memory includes a second memory cell array that includes a first parity region to store parity bits associated with user data set corresponding to all of the data set stored in each of the data memories and a second parity region to store second parity bits for error detection/correction, associated with the parity bits, and the memory controller includes: a cyclic redundancy check generator to generate the first parity bits based on each of the data set and to generate the second parity bits based on the parity bits; and a parity generator to generate the parity bits based on the user data set.

In accordance with one or more other embodiments, a method is provided for operating a memory system, which includes a memory module and a memory controller to control the memory module, the memory module including a plurality of data memories and at least one parity memory. The method includes storing, by a memory controller, a data set and first parity bits associated with the data set in a first memory region and a second memory region, respectively, of each of the data memories, the data set corresponding to a plurality of burst lengths and the first parity bits to be used for error detection/correction; and storing, by the memory controller, first parity bits and second parity bits associated with the parity bits, respectively, in a first parity region and a second parity region of the at least one parity memory, the first parity bits corresponding to all of the data set to be stored in each of the data memories and the second parity bits to be used to perform error detection/correction.

In accordance with one or more other embodiments, a memory module includes a first data memory; a second data memory; and at least one parity memory, wherein: each of the first data memory and the second data memory includes a first memory region to store a data set corresponding to a plurality of burst lengths and a second memory region to store first parity bits for the data set, the at least one parity memory includes a first parity region to store parity bits corresponding to a user data set and a second parity region to store second parity bits for the parity bits.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
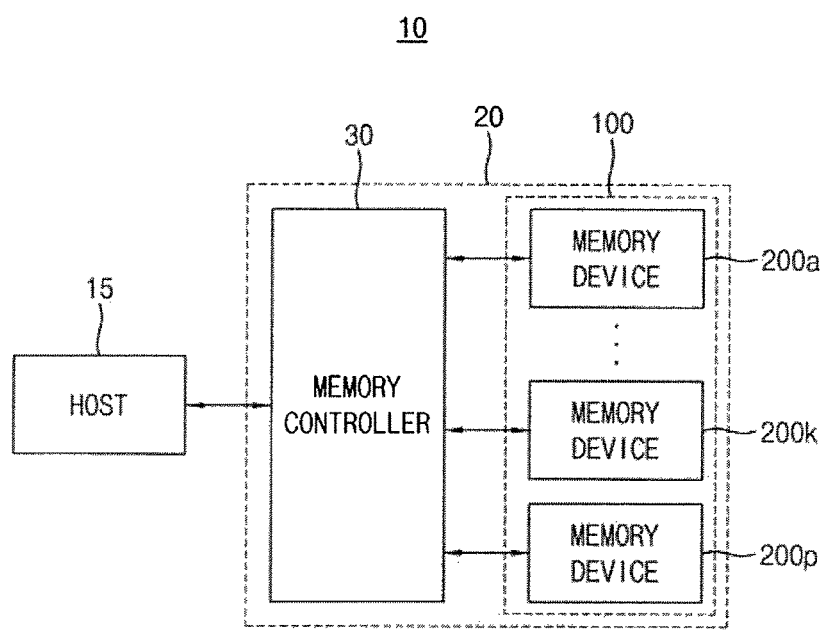
FIG. 1 illustrates an embodiment of an electronic system.

FIG. 1 illustrates an embodiment of an electronic system 10 which may include a host 15 and a memory system 20. The memory system 20 may include a memory controller 30 and a memory module 100. The memory module 100 includes a plurality of memory devices including data memories 200*a*~200*k* and a parity memory 200*p*.

The host 15 may communicate with the memory system 20 through various interface protocols. Examples include Peripheral Component Interconnect-Express (PCI-E), Advanced Technology Attachment (ATA), Serial ATA (SATA), Parallel ATA (PATA), or serial attached SCSI (SAS). The host 15 may also communicate with the memory system 20 through interface protocols. Examples include Universal Serial Bus (USB), Multi-Media Card (MMC), Enhanced Small Disk Interface (ESDI), or Integrated Drive Electronics (IDE).

The memory controller 30 may control overall operation of the memory system 20. The memory controller 30 may control overall data exchange between the host 15 and the memory devices 200*a*~200*k* and 200*p*. For example, the memory controller 30 may write data in the memory devices 200*a*~200*k* and 200*p* or read data from the memory devices 200*a*~200*k* and 200*p* based on request from the host 15. In addition, the memory controller 30 may issue operation commands for controlling the memory devices 200*a*~200*k* and 200*p*.

In some embodiments, each of the semiconductor memory devices 200*a*~200*k* and 200*p* is a memory device including resistive type memory cells. Examples include magnetoresistive random access memory (MRAM), a resistive random access memory (RRAM), a phase change random access memory (PRAM), and a ferroelectric random access memory (FRAM). In other exemplary embodiments, each of the semiconductor memory devices 200*a*~200*k* and 200*p* includes dynamic memory cells such as a dynamic random access memory (DRAM).

An MRAM is a nonvolatile computer memory based on magnetoresistance. An MRAM is different from a volatile RAM in many aspects, e.g., because an MRAM is a nonvolatile memory, an MRAM retains all stored data when powered off.

Even though a nonvolatile RAM may be slower than a volatile RAM, an MRAM has read and write response times comparable with read and write response times of a volatile RAM. Unlike a volatile RAM that stores data as an electric charge, an MRAM stores data using magnetoresistance (or magnetoresistive) elements. Each magnetoresistance element may include, for example, two magnetic layers, each having a magnetization.

An MRAM is a nonvolatile memory device that reads and writes data using a magnetic tunnel junction pattern, which includes an insulating film between two magnetic layers. The resistance value of the magnetic tunnel junction pattern may vary according to the magnetization direction of each of the magnetic layers. The MRAM may program or remove data based on variation of the resistance value. An MRAM is low cost and has high capacity (e.g., like a dynamic random access memory (DRAM), operates at high speed (like a static random access memory (SRAM), and is nonvolatile (like a flash memory).

Figure 2:
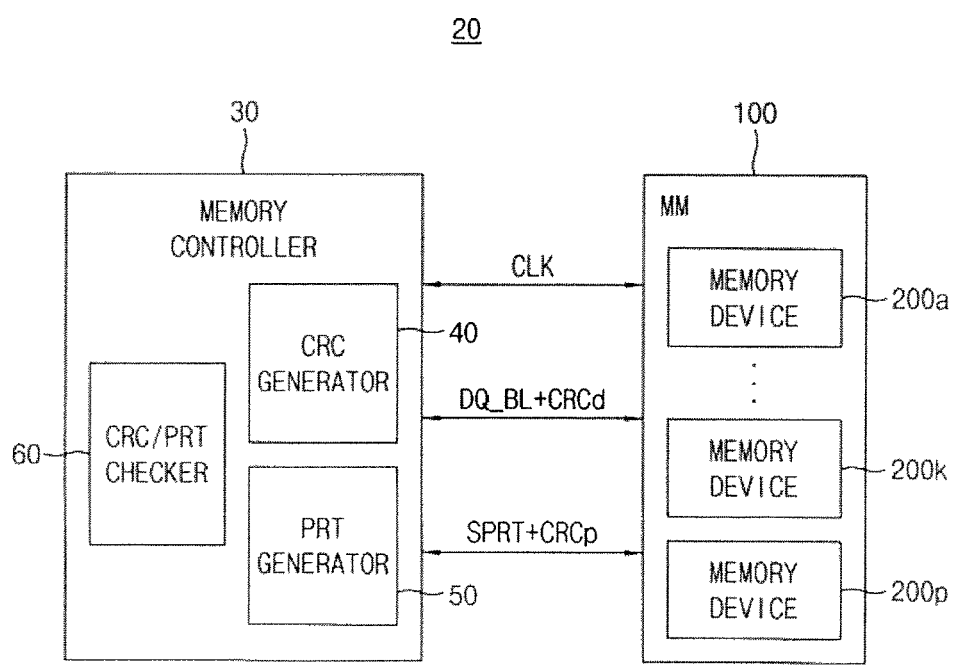
FIG. 2 illustrates an embodiment of a memory system.

FIG. 2 illustrates an embodiment of a memory system, which, for example, may correspond to the memory system 20 in FIG. 1. Referring to FIG. 2, the memory system 20 includes the memory controller 30 and the memory module 100. The memory module 100 includes the plurality of data memories 200*a*~200*k* and at least one parity memory 100*p*. The number of the data memories 200*a*~200*k* may be 8, 16, or another number.

In exemplary embodiments, each of the data memories 200*a*~200*k* may be referred to as a data chip and the parity memory 200*p* may be referred to as an error correction code (ECC) memory or a redundant memory. The parity memory 200*p* may be referred to as an ECC chip or a redundant chip. The parity memory 200*p* may be implemented with one or more parity memories.

The memory controller 100 and the memory module 100 may exchange a first data set DQ_BL+CRCd and a second data set SPRT+CRCp based on a clock signal CLK. The first data set DQ_BL+CRCd includes a data set DQ_BL corresponding to a plurality of burst lengths, which is provided to/output from each of the data memories 200*a*~200*k*, and first parity bits CRCd for error detection/correction associated with the data set DQ_BL. The second data set SPRT+CRCp includes parity bits SPRT associated a data set corresponding to all of the data set DQ_BL to be stored in each of the data memories 200*a*~200*k* and second parity bits CRCp associated with the parity bits SPRT.

The memory controller 30 includes a parity generator 50 and a cyclic redundancy check (CRC) generator 40. The parity generator 50 generates the parity bits SPRT based on the user data set. The CRC generator 40 generates the first parity bits CRCd and the second parity bits CRCp based on the data set DQ_BL and the parity bits SPRT. In addition, the memory controller 30 includes a CRC/parity checker 60 that detects an error of at least one of the data memories 200*a*~200*k* based on the first data set DQ_BL+CRCd and the second data set SPRT+CRCp provided from the memory module (MM) 100.

Each of the data memories 200*a*~200*k* and the parity memory 200*p* may perform a burst operation. The burst operation may include an operation of writing or reading an amount of data by sequentially increasing or decreasing an initial address provided from the memory controller 30. A basic unit of the burst operation may be referred to a burst length BL.

In exemplary embodiments, the burst length BL may correspond to the number of operations of continuously reading or writing data by sequentially increasing or decreasing an initial address. For example, when each of the data memories 200*a*~200*k* and the parity memory 200*p* is a double data rate (DDR) DRAM and a burst length thereof is 8, a burst read or write operation may be performed eight times by sequentially increasing or decreasing an initial address based on the clock signal CLK.

Figure 3A:
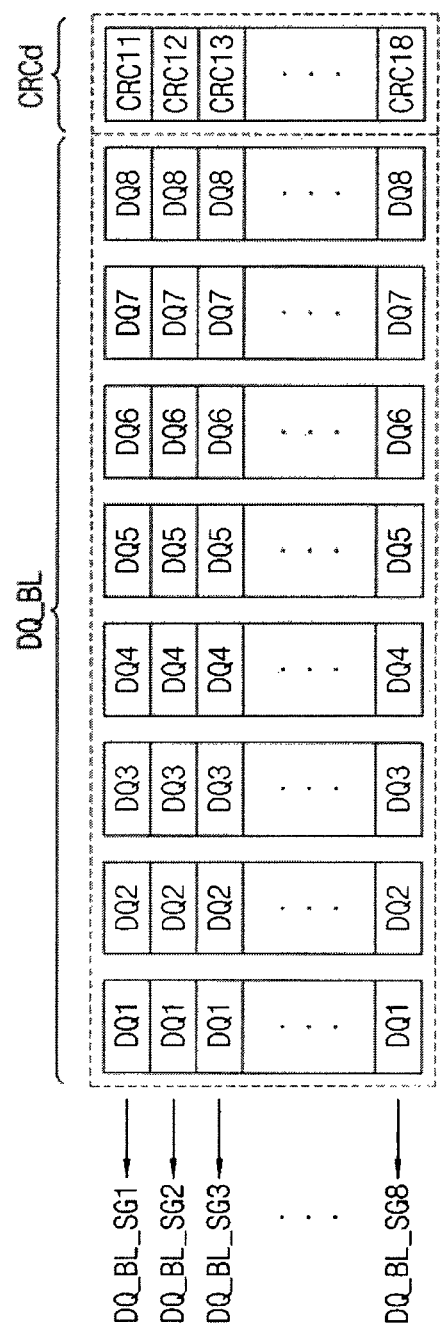
FIG. 3A illustrates an example of a data set corresponding to burst lengths and first parity bits for error detection/correction in the memory system.

FIG. 3A illustrates an example of a data set corresponding to the burst lengths and first parity bits for error detection/correction in the memory system 20 of FIG. 2. Referring to FIG. 3A, the data set DQ_BL corresponding to the burst lengths and the first parity bits CRCd associated with the data set DQ_BL are input to/output from each of the data memories 200a~200k. The data set DQ_BL includes data segments DQ_BL_SG1~DQ_BL_SG8 which correspond to respective burst lengths. For illustrative purposes, the first parity bits CRCd include CRC bits CRC11~CRC18 and the burst length is assumed to be 8 in FIG. 3A. The number of CRC bits and the burst length may be different in another embodiment.

When the data set DQ_BL corresponding to the burst lengths is stored in a first memory region of each of the data memories 200a~200k, the first parity bits CRC11~CRC18 associated with the data set DQ_BL are stored in a second memory region of each of the data memories 200a~200k.

Figure 3B:
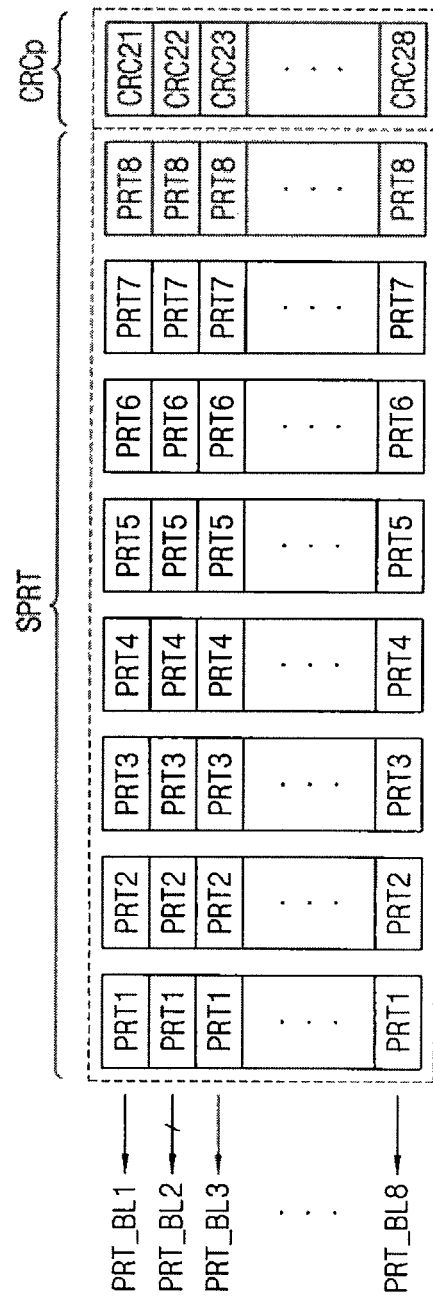
FIG. 3B illustrates an example of parity bits corresponding to burst lengths and second parity bits for error detection/correction in the memory system.

FIG. 3B illustrates an example of parity bits corresponding to the burst lengths and second parity bits for error detection/correction in the memory system 20 of FIG. 2. Referring to FIG. 3B, the parity bits PRT_BL1~BRT_BL8 corresponding to one burst length and the second parity bits CRCp associated with the parity bits SPRT are input to/output from the parity memory 200p as times corresponding to the burst length BL. The first parity bits CRCp include CRC bits CRC21~CRC28, and the burst length is assumed to be 8 in FIG. 3B. The number of CRC bits and the burst length may be different in another embodiment. Each of the parity bits PRT_BL1~BRT_BL8 corresponding to one burst length may be generated based on corresponding data segment DQ_BL_SG to be stored in each of the data memories 200a~200k.

Figure 3C:
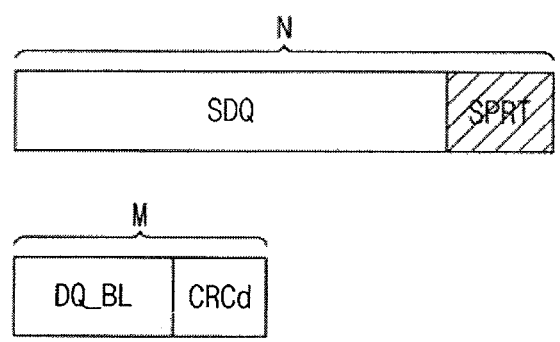
FIG. 3C illustrates an example of structures of N-bit data and M-bit data of the memory system.

FIG. 3C illustrates examples of structures of N-bit data and M-bit data of the memory system 20 of FIG. 2. Referring to FIG. 3C, N-bit data includes the user data set SDQ corresponding to all of the data set DQ_BL and a set of CRC bits SCRC including all of the first parity bits associated with the data set DQ_BL. M-bit data includes the data set DQ_BL to be stored in each of the data memories 200a~200k and the first parity bits CRCd. N-bit data input to/output from the parity memory 200p may include parity bits SPRT associated with the user data set SDQ and the second parity bits CRCp.

Figure 4:
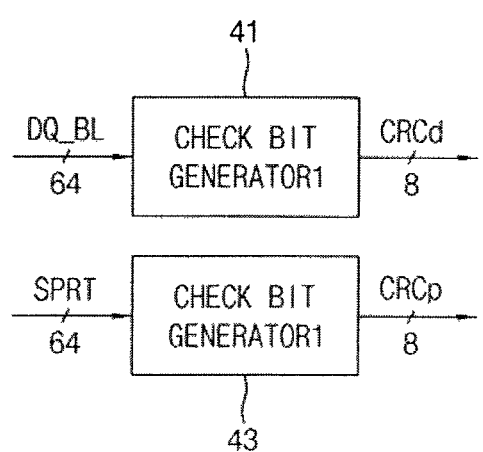
FIG. 4 illustrates an embodiment of a CRC generator in a memory controller.

FIG. 4 illustrates an embodiment of a CRC generator 40 in the memory controller 30 in FIG. 2. Referring to FIG. 4, the CRC generator 40 includes a first check bit generator 41 and the second check bit generator 43. The first check bit generator 41 generates 8-bit first parity bits CRCd based on the 64-bit data set DQ_BL which is to be provided to each of the data memories 200a~200k. The first parity bits CRCd may be sequentially stored in a write buffer. The second check bit generator 43 generates 8-bit second parity bits CRCp based on the 64-bit parity bits SPRT which is provided from the parity generator 50. The second parity bits CRCp may be stored in the write buffer.

Figure 5:
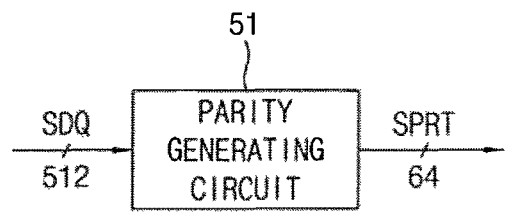
FIG. 5 illustrates an embodiment of a parity generator in a memory controller.

FIG. 5 illustrates an embodiment of a parity generator 50 in the memory controller 30 in FIG. 2. Referring to FIG. 5, the parity generator 50 includes a parity generating circuit 51. The parity generating circuit 51 receives the 512-bit user data set SDQ, and generates the 64-bit parity bits SPRT based on the 512-bit user data set SDQ. The parity generating circuit 51 may be implemented with an ECC encoder. The parity bits SPRT may be stored in the write buffer. The first parity bits CRCd, the second parity bits CRCp and the parity bits SPRT may be provided to the memory module 100 along with the user data set SDQ.

Figure 6:
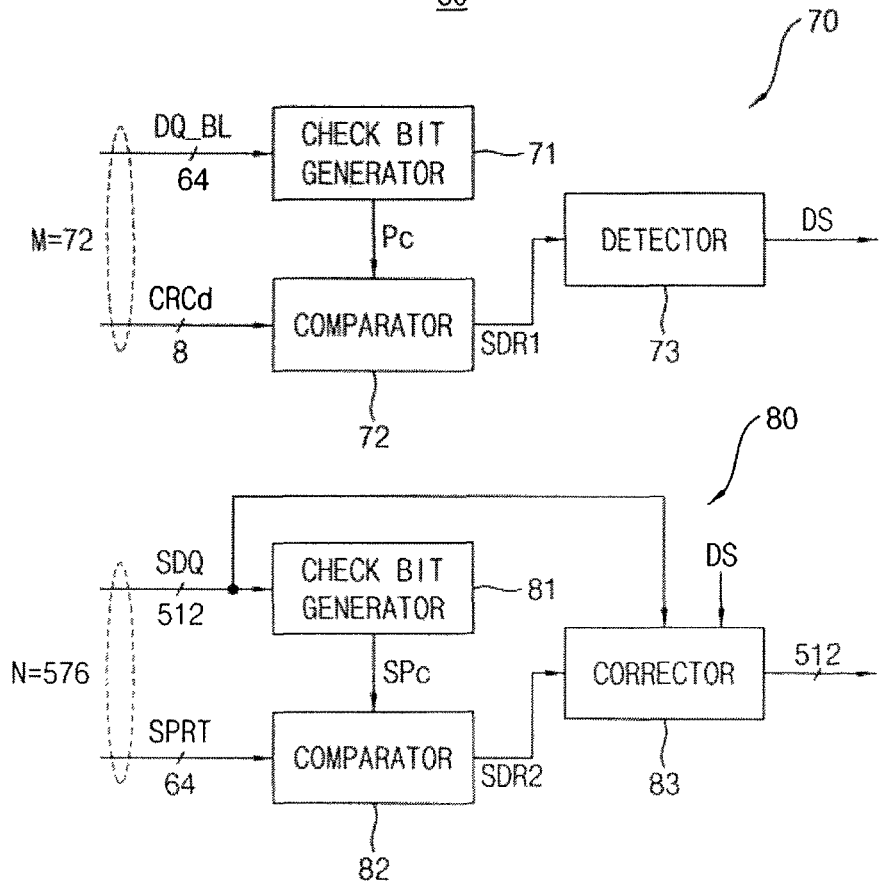
FIG. 6 illustrates an embodiment of a CRC/parity checker in a memory controller.

FIG. 6 illustrates an embodiment of a CRC/parity checker 60 in the memory controller 30 in FIG. 2. Referring to FIG. 6, the CRC/parity checker 60 includes a CRC checker 70 and a parity checker 80. The CRC checker 70 includes a check bit generator 71, a comparator 72 and a detector 73. The check bit generator 71 receives the 64-bit data set DQ_BL and generates 8-bit check bits Pc based on the 64-bit data set DQ_BL. The comparator 72 compares corresponding bits of the 8-bit first parity bits CRCd and the 8-bit check bits Pc and generates a syndrome SDR1 indicating whether an error occurs and the position of the error. The detector 73 generates a detection signal DS when the error occurs in the 64-bit data set DQ_BL, based on the syndrome SDR1.

The parity checker 80 includes a check bit generator 81, a comparator 82 and a corrector 83. The check bit generator 81 receives the 512-bit user data set SDQ and generates a check bit set SPc based on the 512-bit user data set SDQ. The comparator 72 compares corresponding bits of the 64-bit parity bits SPRT and the parity bit set SPc and generates a syndrome SDR2 indicating whether an error occurs and the position of the error. The corrector 83 receives the 512-bit user data set SDQ, inverts data of the data set DQ_BL in which the error occurs based on the detection signal and the syndrome SDR2, and corrects an error in the user data set SDQ.

Figure 7:
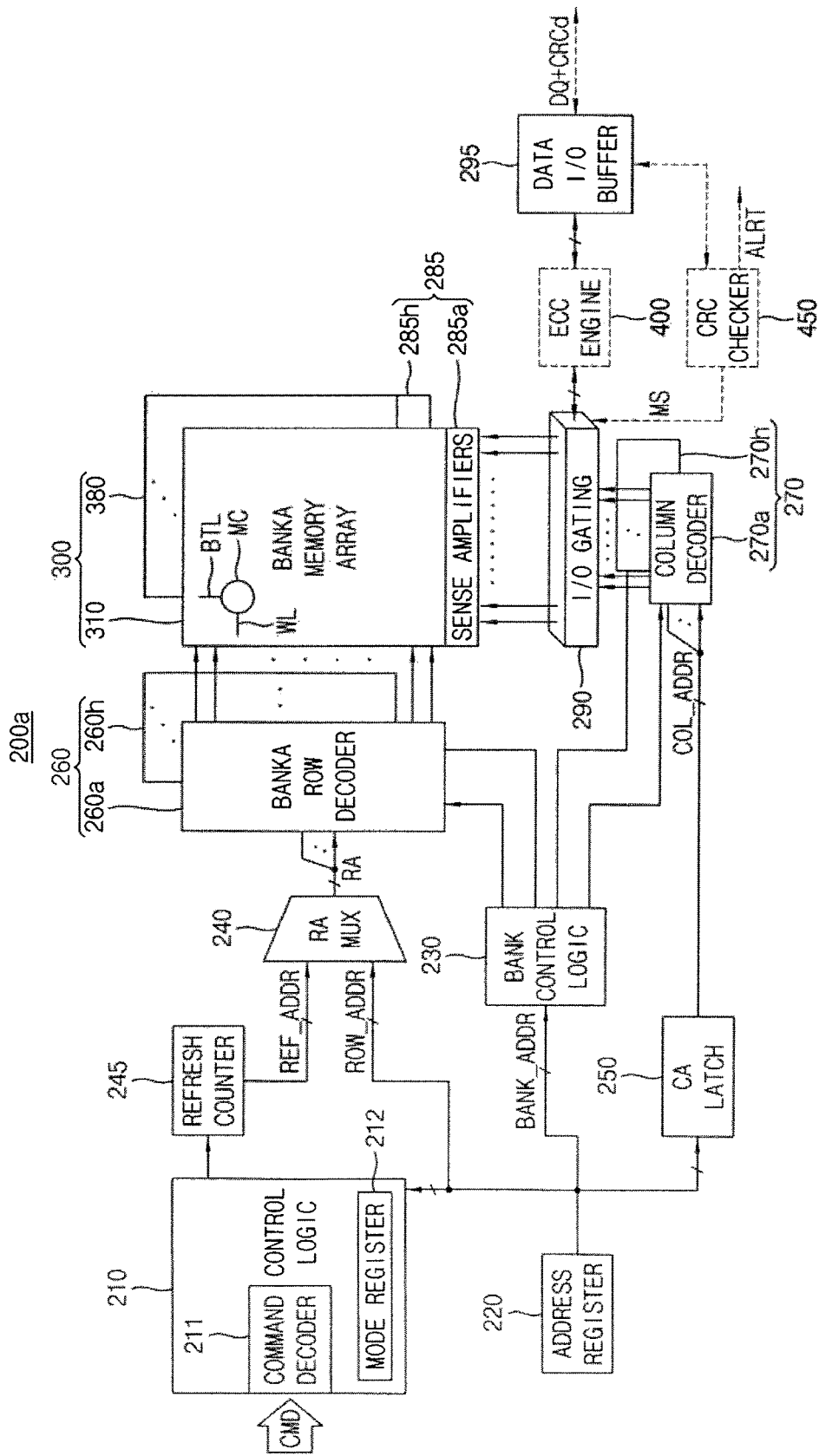
FIG. 7 illustrates an embodiment of a data memory in a memory module.

FIG. 7 illustrates an embodiment of a data memory 200a, which may be representative of the data memories 200b~200k and the parity memory 200p in the memory module 100 in FIG. 2.

Referring to FIG. 7, the data memory 200a includes a control logic circuit 210, an address register 220, a bank control logic 230, a row address multiplexer 240, a column address latch 250, a row decoder 260, a column decoder 270, a memory cell array 300, a sense amplifier unit 285, an input/output (I/O) gating circuit 290, a data input/output (I/O) buffer 295 and a refresh counter 245. The data memory 200a may further include one of an ECC engine 400 and a CRC checker 450. When the data memory 200a is implemented with a resistive-type memory device, the data memory 220a does not include the refresh counter 245.

The memory cell array 300 includes first through eighth bank arrays 310~380. The row decoder 260 includes first through eighth bank row decoders 260a~260h respectively coupled to the first through eighth bank arrays 310~380. The column decoder 270 includes first through eighth bank column decoders 270a~270h respectively coupled to the first through eighth bank arrays 310~380. The sense amplifier unit 285 includes first through eighth bank sense amplifiers 285a~285h respectively coupled to the first through eighth bank arrays 310~380. The first through eighth bank arrays 310~380, the first through eighth bank row decoders 260a~260h, the first through eighth bank column decoders 270a~270h, and first through eighth bank sense amplifiers 285a~285h may form first through eighth banks. Each of the first through eighth bank arrays 310~380 includes a plurality of memory cells MC coupled to word-lines WL and bit-lines BTL. The data memory 200a may include a different number of banks in another embodiment.

The address register 220 receives an address ADDR including a bank address BANK_ADDR, a row address ROW_ADDR and a column address COL_ADDR and the command CMD from the memory controller 30. The address register 220 may provide the received bank address BANK_ADDR to the bank control logic 230, may provide the received row address ROW_ADDR to the row address multiplexer 240, and may provide the received column address COL_ADDR to the column address latch 250.

The bank control logic 230 may generate bank control signals based on the bank address BANK_ADDR. One of the first through eighth bank row decoders 260a~260h corresponding to the bank address BANK_ADDR may be activated based on the bank control signals. One of the first through eighth bank column decoders 270a~270h corresponding to the bank address BANK_ADDR may be activated based on the bank control signals.

The row address multiplexer 240 may receive the row address ROW_ADDR from the address register 220 and may receive a refresh row address REF_ADDR from the refresh counter 245. The row address multiplexer 240 may selectively output one of the row address ROW_ADDR or the refresh row address REF_ADDR as a row address RA. The row address RA output from the row address multiplexer 240 may be applied to the first through eighth bank row decoders 260a~260h.

The activated one of the first through eighth bank row decoders 260a~260h may decode the row address RA output from the row address multiplexer 240, and may activate a word-line corresponding to the row address RA. For example, the activated bank row decoder may apply a word-line driving voltage to the word-line corresponding to the row address RA.

The column address latch 250 may receive the column address COL_ADDR from the address register 220 and may temporarily store the received column address COL_ADDR. In some embodiments, in burst mode, the column address latch 250 may generate column addresses that increment from the received column address COL_ADDR. The column address latch 250 may apply the temporarily stored or generated column address to the first through eighth bank column decoders 270a~270h.

The activated one of the first through eighth bank column decoders 270a~270h may decode the column address COL_ADDR output from the column address latch 250, and may control the input/output gating circuit 290 in order to output data corresponding to the column address COL_ADDR or the mapped column address MCA.

The I/O gating circuit 290 includes a circuitry for gating input/output data. The I/O gating circuit 290 further includes read data latches for storing data that is output from the first through eighth bank arrays 310~380, and write drivers for writing data to the first through eighth bank arrays 310~380.

Data to be read from one bank array of the first through eighth bank arrays 310~380 may be sensed by a sense amplifier, coupled to the one bank array from which the data is to be read, and may be stored in the read data latches. The data stored in the read data latches is ECC-decoded by the ECC engine 400 and may be provided to the memory controller 30 via the data I/O buffer 295.

Data DQ and the first parity data CRCd to be written in one of the first through eighth bank arrays 310~380 may be provided to the data I/O buffer 295 from the memory controller 30. The data DQ and the first parity data CRCd are provided to the write driver. The write driver may write the data MD and the first parity data CRCd in a first memory region and a second memory region, respectively, in one bank array of the first through eighth bank arrays 310~380.

The control logic circuit 210 may control operations of the data memory 200a. For example, the control logic circuit 210 may generate control signals for the data memory 200a to perform a write operation or a read operation. The control logic circuit 210 may include a command decoder 211 that decodes a command CMD from the memory controller 30 and a mode register 212 that sets an operation mode of the data memory 200a. The command decoder 211 may, for example, generate the control signals corresponding to the command CMD by decoding a write enable signal (/WE), a row address strobe signal (/RAS), a column address strobe signal (/CAS), a chip select signal (/CS), etc.

When the data memory 200a includes the CRC checker 450, the CRC checker 450 detects a transmission error which may occur while the data DQ is transmitted and transmits an alert signal ALRT to the memory controller 30 indicating a transmission error has occurred in a write operation of the data memory 200a. The data memory 200a may transmit the alert signal ALRT to the memory controller 30, for example, through a dedicated pin. When the memory controller 30 receives the alert signal ALRT which is enabled, the memory controller 30 transmits the data DQ and the first parity bits CRCd to the data memory 200a again.

The CRC checker 450 may provide the I/O gating circuit 290 with a mode signal MS indicating whether an error has occurred. When the mode signal MS indicates that an error has not occurred in the transmitted data DQ, the I/O gating circuit 290 writes the data DQ and the first parity bits CRCd in a corresponding bank array. When the mode signal MS indicates that an error has occurred in the transmitted data DQ, the I/O gating circuit 290 may block writing the data DQ and the first parity bits CRCd in a corresponding bank array. The CRC checker 450 may employ a CRC checker 70, for example, as illustrated in FIG. 6.

When the data memory 200a includes the ECC engine 400, the ECC engine 400 includes the CRC checker 450, and the ECC engine 400 performs the above-mentioned operation. The ECC engine 400 may include an ECC decoder, which performs ECC decoding on the data DQ based on the first parity bits CRCd stored in the bank array and detects/corrects an error of the data DQ in a read operation.

Figure 8A:
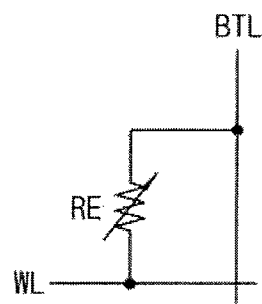
FIGS. 8A to 8E illustrate various embodiments of a memory cell.
Figure 8B:
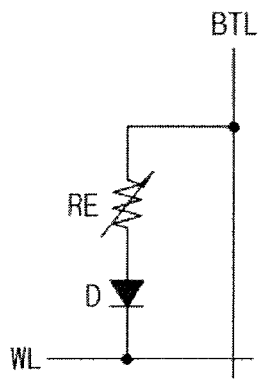
Figure 8C:
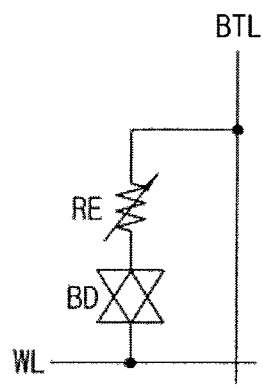
Figure 8D:
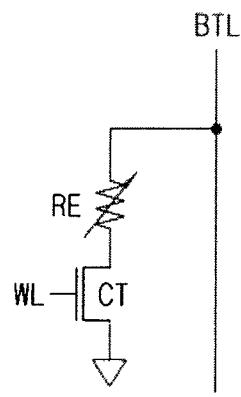
Figure 8E:
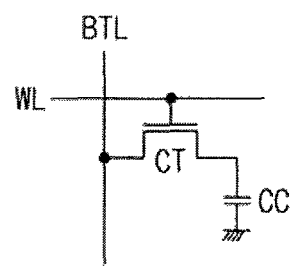

FIGS. 8A to 8E illustrate embodiments of a memory cell, which, for example, may be included in the data memory of FIG. 7. FIGS. 8A to 8D illustrate memory cells MC that are resistive type memory cells, and FIG. 8E illustrates a memory cell MC that is a dynamic memory cell. Moreover, FIG. 8A illustrates a resistive type memory cell without a selection element, and FIGS. 8B to 8D illustrate resistive type memory cells which include selection elements.

Referring to FIG. 8A, a memory cell MC includes a resistive element RE connected to a bit-line BTL and a word-line WL. Such a resistive memory cell without a selection element may store data based on a voltage applied between bit-line BL and word-line WL.

Referring to FIG. 8B, a memory cell MC includes a resistive element RE and a diode D. The resistive element RE may include a resistive material for data storage. The diode D may be a selection element (or switching element) that supplies current to resistive element RE or cuts off the current supply to resistive element RE according to a bias of word-line WL and bit-line BTL. The diode D may be coupled between the resistive element RE and word-line WL. The resistive element RE may be coupled between the bit-line BTL and the diode D. Positions of the diode D and the resistive element RE may be interchangeable. The diode D may be turned on or turned off by a word-line voltage. Thus, a resistive memory cell may be not driven where a voltage of a constant level or higher is supplied to an unselected word-line WL.

Referring to FIG. 8C, a memory cell MC includes a resistive element RE and a bidirectional diode BD. The resistive element R may include a resistive material for data storage. The bidirectional diode BD may be coupled between the resistive element RE and a word-line WL. The resistive element RE may be coupled between a bit-line BTL and bidirectional diode BD. Positions of the bidirectional diode BD and the resistive element RE may be interchangeable. The bidirectional diode BD may block leakage current flowing to an unselected semiconductor memory cell.

Referring to FIG. 8D, a memory cell MC includes a resistive element RE and a transistor CT. The transistor CT may be a selection element (or switching element) that supplies current to the resistive element RE or cuts off the current supply to the resistive element RE according to a voltage of a word-line WL. The transistor CT may be coupled between the resistive element RE and a word-line WL. The resistive element RE may be coupled between a bit-line BTL and the transistor CT. Positions of the transistor CT and the resistive element RE may be interchangeable. The semiconductor memory cell may be selected or unselected depending on whether the transistor CT drive by word-line WL is turned on or turned off.

Referring to FIG. 8E, a memory cell MC includes a cell capacitor CC and a transistor CT. The transistor CT may be a selection element (or switching element) that connects/disconnects the cell capacitor CC to/from hit-line BTL according to a voltage of a word-line WL. The transistor CT may be coupled between the cell capacitor CC, a word-line WL, and a bit-line BTL. The cell capacitor CC may be coupled between the transistor CT and a plate voltage.

Figure 9:
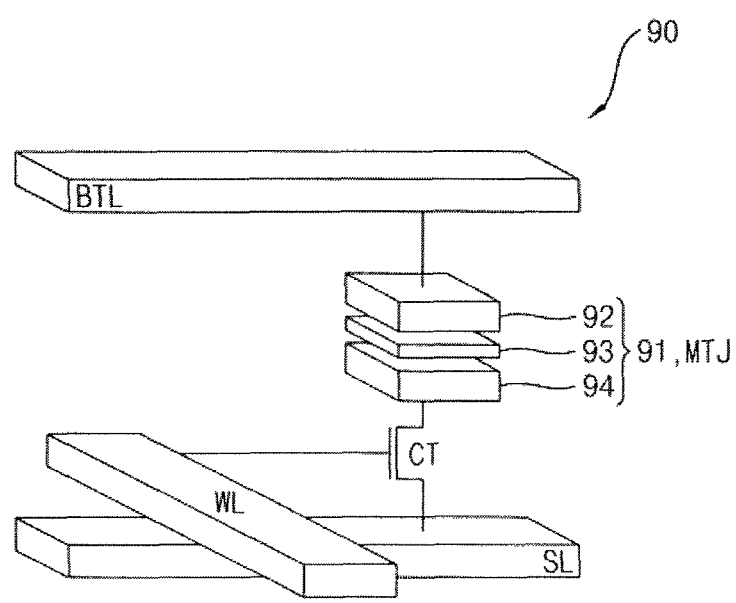
FIG. 9 illustrates an embodiment of an STT-MRAM cell.

FIG. 9 illustrates an embodiment of the memory cell in the form of an STT-MRAM cell 90 in FIG. 7. Referring to FIG. 9, an STT-MRAM cell 90 includes a MTJ element 91 and a cell transistor CT. A gate electrode of the cell transistor CT is connected to a word-line WL, and one electrode of the cell transistor CT is connected through the MTJ element 91 to a bit-line BTL. The other (third) electrode of the cell transistor CT is connected to a source line SL.

The MTJ element 91 includes a tunnel layer 93 between a free layer 92 and a pinned layer 94. The magnetization direction of the pinned layer 94 may be fixed. The magnetization direction of the free layer 92 may be parallel or anti-parallel to the magnetization direction of the pinned layer 94 according to written data. In order to fix the magnetization direction of the pinned layer 94, for example, an anti-ferromagnetic layer may be further provided.

In order to perform a write operation of the STT-MRAM cell 90, a logical high voltage is applied to the word-line WL to turn on the cell transistor CT. A program current, for example, a write current is applied to the bit-line BTL and the source line SL. The direction of the write current is determined by the logical state of the MTJ element 40.

In order to perform a read operation of the STT-MRAM cell 90, a logical high voltage is applied to the word-line WL to turn on the cell transistor CT. A read current is supplied to the bit-line BTL and the source line SL. Accordingly, a voltage is developed at different ends of the MTJ element 91. This voltage is detected by the sense amplifier 285a and is compared with a reference voltage from a reference voltage to determine a logic state of the MTJ element 91. Accordingly, data stored in the MTJ element 91 may be detected.

Figure 10:
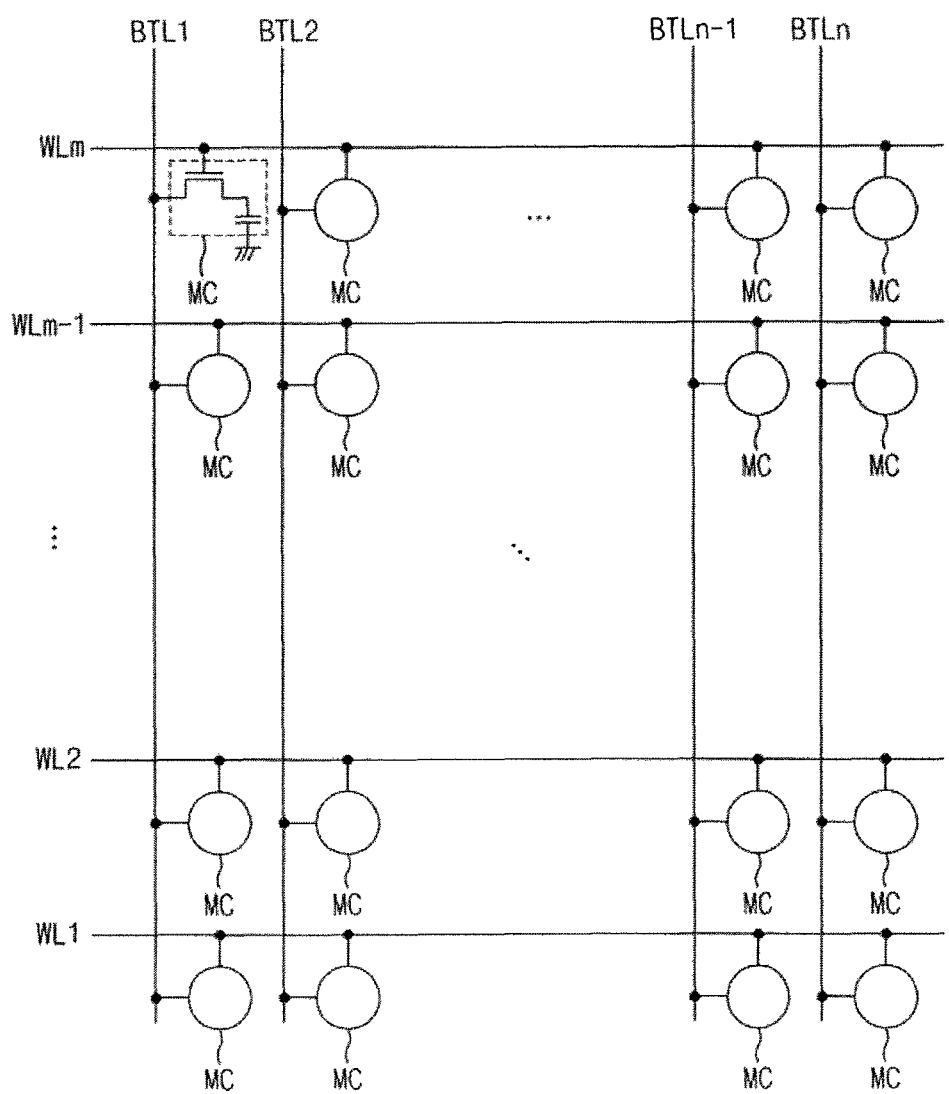
FIG. 10 illustrates an embodiment of a first bank array.

FIG. 10 illustrates an embodiment of a bank array, which, for example, may correspond to the first bank array in the data memory of FIG. 7. Referring to FIG. 10, the first bank array 310 a plurality of word-lines WL1~WLm (m is a natural number greater than two), a plurality of bit-lines BTL1~BTLn (n is a natural number greater than two), and a plurality of memory cells MCs disposed near intersections between the word-lines WL1~WLm and the bit-lines BTL1~BLTn. In one embodiment, each of the memory cells MCs may include a dynamic random access memory (DRAM) cell structure. The word-lines WL1~WLm connected to the memory cells MCs may correspond to rows of the first bank array 310. The bit-lines BTL1~BTLn connected to the memory cells MCs may correspond to columns of the first bank array 310.

Figure 11:
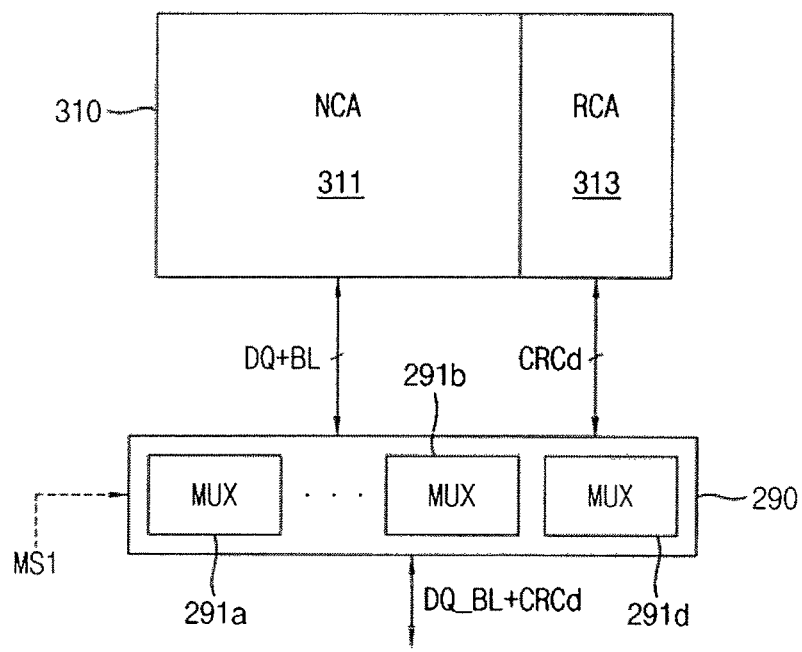
FIG. 11 illustrates an embodiment of a first bank array and an I/O gating circuit.

FIG. 11 illustrates an embodiment of a first bank array and the I/O gating circuit in the data memory of FIG. 7. Referring to FIG. 11, the first bank array 310 of the data memory 200a includes a first memory region 311 and a second memory region 313.

The I/O gating circuit 290 includes a plurality of switches 291a, 291b and 291d. The switches 291a and 291b are connected to the first memory region 311 and the switch 291d is connected to the second memory region 313. The I/O gating circuit 290 receives the data set DQ_BL and the first parity bits CRCd associated with the data set DQ_BL from the data I/O buffer 295, stores the data set DQ_BL in the first memory region 311, and stores the first parity bits CRCd in the second memory region 313.

When the data memory 200a includes the CRC checker 450 or the ECC engine 400 in FIG. 7, a mode signal MS1 is provided to the switches 291a, 291b and 291d. The switches 291a, 291b and 291d are turned on/off based on the mode signal MS1 to transfer the data set DQ_BL and the first parity bits CRCd to the first memory region 311 and the second memory region 313, respectively. Or, the switches 291a, 291b and 291d are turned on/off based on the mode signal MS1 to block transfer of the data set DQ_BL and the first parity bits CRCd to the first memory region 311 and the second memory region 313.

Figure 12:
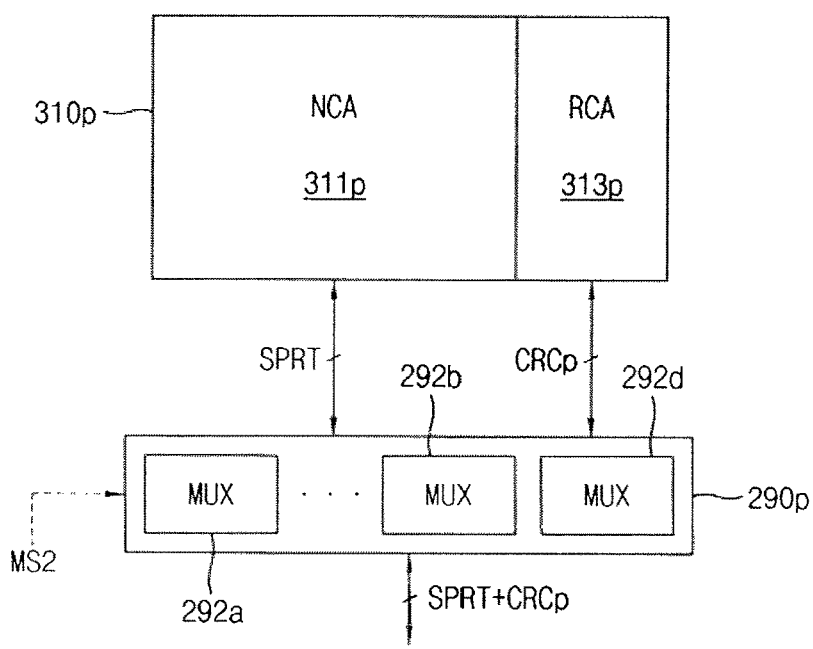
FIG. 12 illustrates an embodiment of a first bank array and an I/O gating circuit.

FIG. 12 illustrates an embodiment of a first bank array and the I/O gating circuit in the parity memory in the memory module in FIG. 2. Referring to FIG. 12, a first bank array 310p of the parity memory 200p includes a first parity region 311p and a second parity region 313p.

An I/O gating circuit 290p includes a plurality of switches 292a, 292b and 292d. The switches 292a and 292b are connected to the first parity region 311p. The switch 292d is connected to the second parity region 313p. The I/O gating circuit 290p receives the parity bits SPRT and the second parity bits CRCp associated with the parity bits SPRT from a data I/O buffer of the parity memory 200p, stores the parity bits SPRT in the first parity region 311p, and stores the second parity bits CRCp in the second parity region 313p.

When the parity memory 200p includes the CRC checker 450 or the ECC engine 400 in FIG. 7, a mode signal MS2 is provided to the switches 292a, 292b and 292d. The switches 292a, 292b and 292d are turned on/off based on the mode signal MS2 to transfer the parity bits SPRT and the second parity bits CRCp to the first parity region 311p and the second parity region 313p, respectively. Or, the switches 292a, 292b and 292d are turned on/off based on the mode signal MS2 to block the transfer of the parity bits SPRT and the second parity bits CRCp to the first parity region 311p and the second parity region 313p.

Figure 13A:
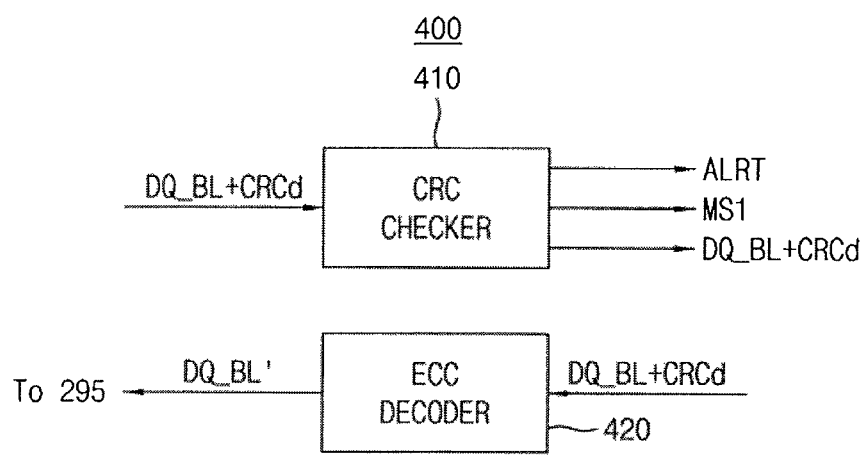
FIG. 13A illustrates an embodiment of an ECC engine.

FIG. 13A illustrates an embodiment of the ECC engine in the data memory of FIG. 7. Referring to FIG. 13A, the ECC engine 400 includes a CRC checker 410 and an ECC decoder 420.

The CRC checker 410 detects a transmission error which may occur while the data set DQ_BL is transmitted to the data memory based on the data set DQ_BL and the first parity bits CRCd, transmits the alert signal ALERT to the memory controller 30 when a transmission error has occurred, and provides the mode signal MS1 to the I/O gating circuit 290 when a transmission error has occurred. The CRC checker 410 may have a configuration, for example, similar to the CRC checker 70 in FIG. 6.

In a read operation, the ECC decoder 420 reads the data set DQ_BL and the first parity bits CRCd respectively from the first data region and the second data region of a corresponding bank array, performs an ECC decoding on the data set DQ_BL using the first parity bits CRCd, corrects an error of the first parity bits CRCd, and outputs the corrected data set DQ_BL'. The CRC checker 410 and the ECC decoder 420 may use a same error correction code.

Figure 13B:
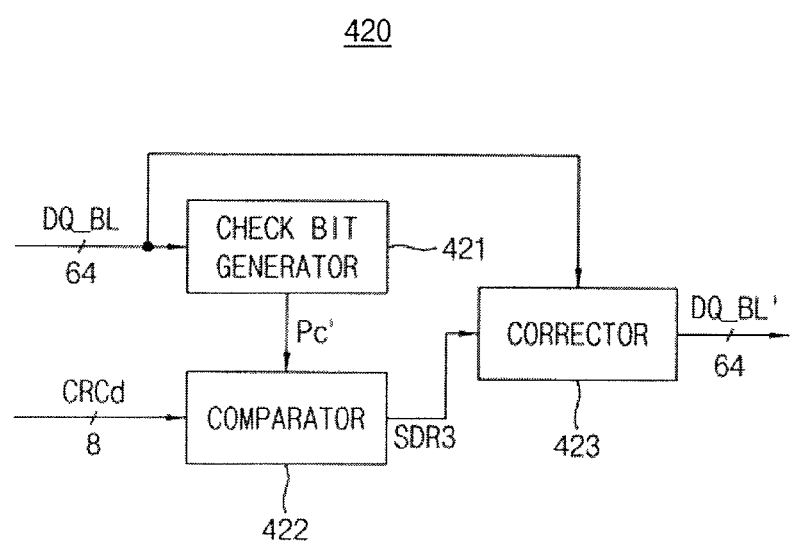
FIG. 13B illustrates an embodiment of an ECC decoder.

FIG. 13B illustrates an embodiment of the ECC decoder in the ECC engine of FIG. 13A. Referring to FIG. 13B, the ECC decoder 420 includes a check bit generator 421, a comparator 422, and a corrector 423.

The check bit generator 421 receives the 64-bit data set DQ_BL and generates 8-bit check bits Pc' based on the 64-bit data set DQ_BL. The comparator 422 compares corresponding bits of the 8 bit first parity bits CRCd and 8-bit check bits Pc' and generates a syndrome SDR3 indicating whether an error occurs and the position of the error. The corrector 423 receives the 64-bit data set DQ_BL, corrects an error in the data set DQ_BL based on the syndrome SDR3, and outputs the corrected data set DQ_BL'.

Figure 14:
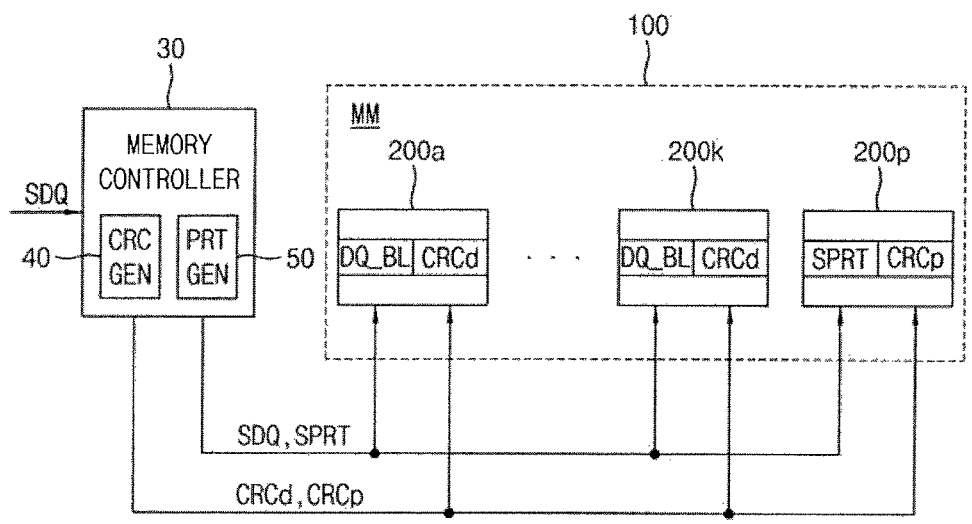
FIG. 14 illustrates an embodiment of a write operation.

FIG. 14 illustrates an embodiment of a write operation performed in the memory system of FIG. 2. Referring to FIG. 14, in a write operation, the memory controller 30 receives the user data set SDQ from the host 15 or from an application, divides the user data set SDQ into a plurality of data sets corresponding to the burst lengths, and sequentially provides the data sets to the CRC generator 40. The parity generator 50 generates the parity bits SPRT based on the user data set SDQ. The CRC generator 40 generates the first parity bits CRCd based on each data set DQ_BL and generates the second parity bits CRCp based on the parity bits SPRT.

The memory controller 30 stores the data set DQ_BL corresponding to the burst lengths in a first memory region of each of the data memory 200a~200k, and stores the parity bits SPRT in a first parity region of the parity memory 200p through a first data bus. The memory controller 30 stores the first parity bits CRCd associated with the data set DQ_BL in a second memory region of each of the data memory 200a~200k, and stores the second parity bits CRCp associated with the parity bits SPRT in a second parity region of the parity memory 200p through a second data bus.

Referring to FIGS. 3A and 3B, while the data segments DQ_BL_SG1 are stored in the first memory region of each of the data memories 200a~200k, parity bits PRT_BL1 associated with the data segments DQ_BL_SG1 are stored in the first parity region of the parity memory 200p. While the data segments DQ_BL_SG2 are stored in the first memory region of each of the data memories 200a~200k, parity bits PRT_BL2 associated with the data segments DQ_BL_SG2 are stored in the first parity region of the parity memory 200p. Thus, the data segments DQ_BL_SG to be stored in the first memory region and the parity bits PRT_BL associated with the data segments DQ_BL_SG may be accessed by a same address.

Figure 15:
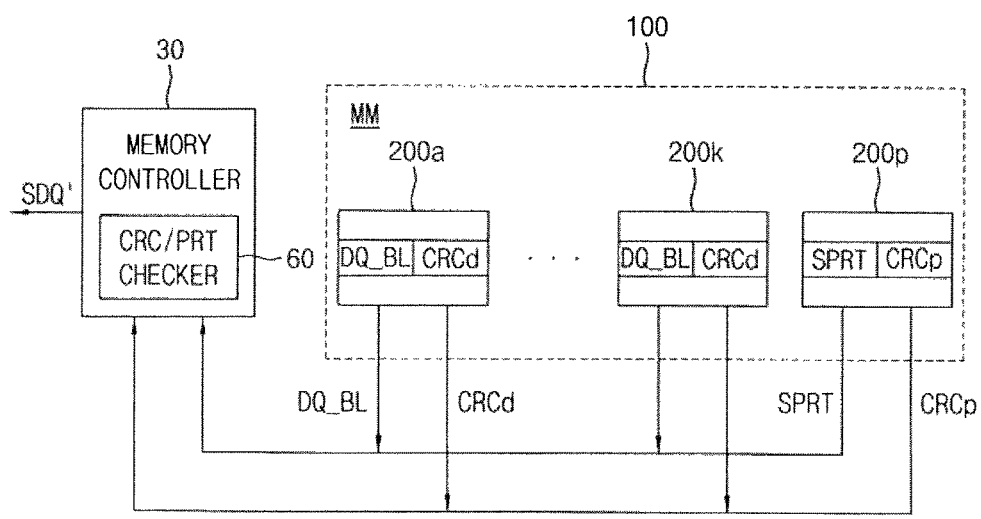
FIG. 15 illustrates another embodiment of a write operation.

FIG. 15 illustrates an embodiment of a write operation performed in the memory system of FIG. 2 Referring to FIG. 15, in a read operation, each of the data memories 200a~200k transmits the data set DQ_BL corresponding to the burst lengths and the first parity bits CRCd to the memory controller 30 and the parity memory 200p transmits the parity bits SPRT associated with all of the data sets DQ_BL and the second parity bits CRCp to the memory controller 30.

As described with reference to FIG. 6, the CRC checker 70 in the CRC/parity checker 60 detects an error of at least one of the data memories for each data set DQ_BL based on the first parity bits CRCd, and provides the parity checker 80 with the detection signal DS indicating whether the error occurs. The parity checker 80 determines type of an error of the at least one error-detected data memory, inverts data of the at least one error detected data memory and provides the corrected user data set SDQ' to the host 15.

Figure 16:
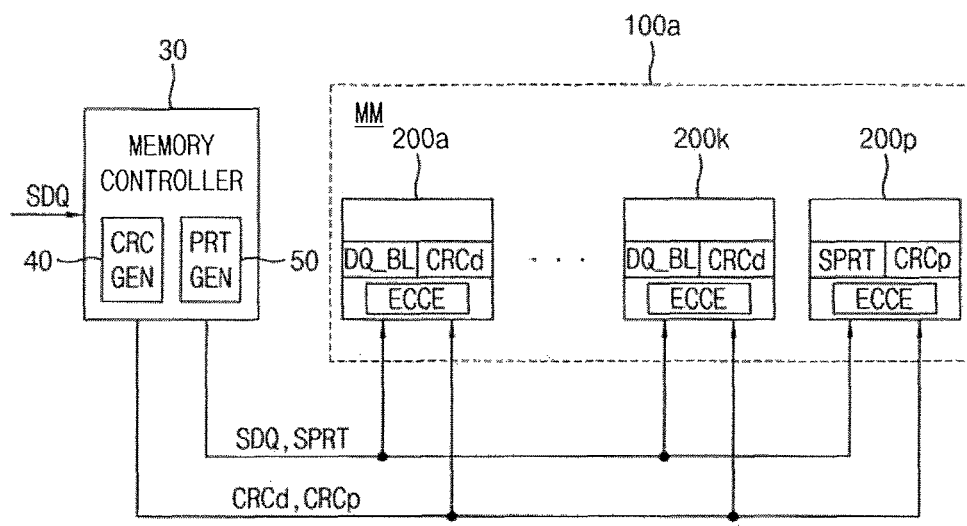
FIG. 16 illustrates another embodiment of a write operation.

FIG. 16 illustrates an embodiment of a write operation performed in the memory system of FIG. 2. A memory module 100a in FIG. 16 differs from the memory module 100 in FIG. 14 in that each of the data memories 200a~200k and the parity memory 200p includes an ECC engine ECCE.

Referring to FIG. 16, in a write operation, the memory controller 30 receives the user data set SDQ from the host 15 and stores the data set DQ_BL corresponding to the burst lengths in the first memory region of each of the data memory 200a~200k, and stores the parity bits SPRT in a first parity region of the parity memory 200p through a first data bus. The memory controller 30 stores the first parity bits CRCd associated with the data set DQ_BL in a second memory region of each of the data memory 200a~200k, and stores the second parity bits CRCp associated with the parity bits SPRT in a second parity region of the parity memory 200p through a second data bus.

The CRC checker of the ECC engine ECCE in each of the data memories 200a~200k, as described with reference to FIG. 13A, detects the transmission error in the data set DQ_BL based on the data set DQ_BL and the first parity bits CRCd, stores the data set DQ_BL in the first memory region when the transmission error does not occur in the data set DQ_BL, and transmits the alert signal ALRT to the memory controller 30 when the transmission error occurs in the data set DQ_BL. In addition, a CRC checker of the ECC engine ECCE in the parity memory 200p detects a transmission error in the parity bits SPRT based on the parity bits SPRT and the second parity bits CRCp.

Figure 17:
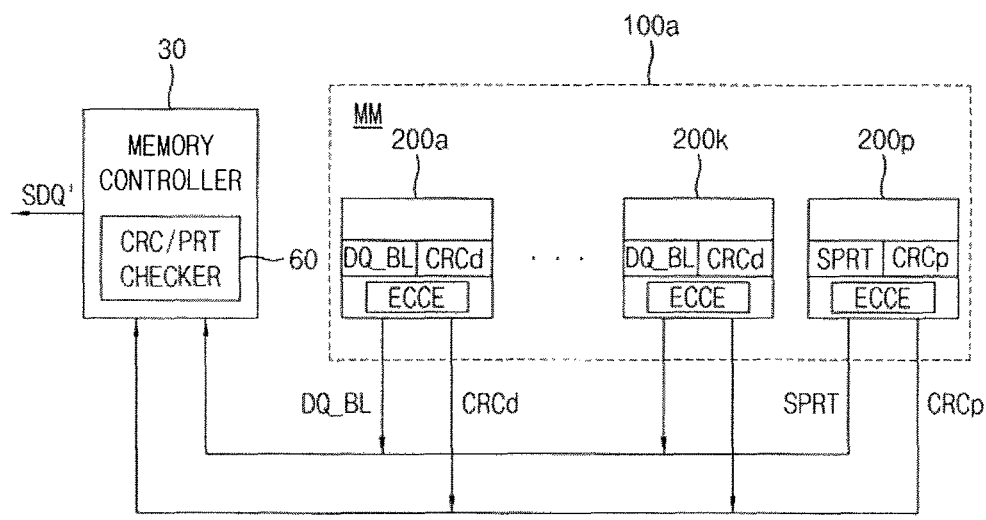
FIG. 17 illustrates another embodiment of a write operation.

FIG. 17 illustrates an embodiment of a write operation performed in the memory system of FIG. 2. A memory module 100a in FIG. 17 differs from the memory module 100 in FIG. 15 in that each of the data memories 200a~200k and the parity memory 200p includes an ECC engine ECCE.

Referring to FIG. 17, as described with reference to FIG. 13B, in a read operation, the ECC decoder in the ECC engine ECCE in each of the data memories 200a~200k performs an ECC decoding on the data set DQ_BL based on the data set DQ_BL read from the first memory region and the first parity bits CRCd read from the second memory region, detects at least one storage error of the data set DQ_BL and corrects the detected error. In this case, the corrector of the ECC decoder corrects the error of the data set DQ_BL and transmits the corrected data set DQ_BL' to the memory controller. An ECC decoder of the ECC engine ECCE of the parity memory 200p performs an ECC decoding on the parity bits SPRT based on the second parity bits CRCp, detects an error of the parity bits SPRT, corrects the error of the parity bits SPRT, and transmits the corrected parity bits to the memory controller 30.

As described with reference to FIGS. 14 to 17, the memory modules 100 and 100a according to exemplary embodiments may implement a chip-kill technique by storing first parity bits CRCd for detecting a transmission error in each of the data memories 200a~200k and storing the parity bits SPRT associated with all of the data set DQ_BL stored in the data memories 200a~200k. The memory modules 100 and 100a do not require an additional CRC memory to store the first parity bits associated with the data set DQ_BL, and a lockstep is not needed when the number of data memories increases. Therefore, memory modules 100 and 100a may provide increased reliability, availability and serviceability.

Figure 18:
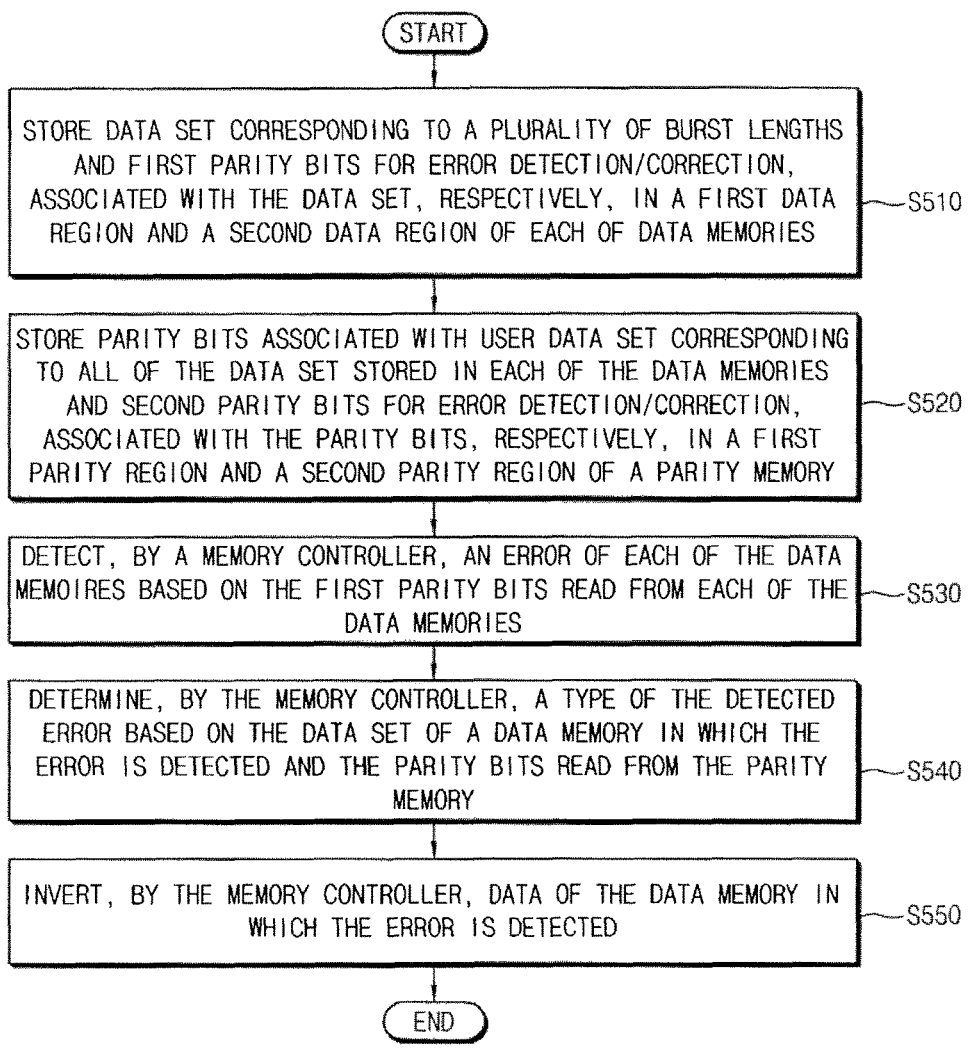
FIG. 18 illustrates an embodiment of a method for operating a memory system.

FIG. 18 illustrates an embodiment of a method for operating a memory system in accordance with one or more of the aforementioned embodiments, e.g., memory system 20 including a memory module 100 having data memories 200a~200k and at least one parity memory 200p and memory controller 30 to control memory module 100.

Referring to FIG. 18, according to this method, the memory controller 30 stores a data set DQ_BL corresponding to a plurality of burst lengths and first parity bits CRCd for error detection/correction, associated with the data set DQ_BL, respectively, in a first memory region 311 and a second memory region 313 of each of the data memories 200a~200k (S510).

The memory controller 30 stores parity bits SPRT associated with user data set SDQ corresponding to all of the data set DQ_BL to be stored in each of the data memories 200a~200k and second parity bits CRCp for error detection/correction, associated with the parity bits SPRT, respectively, in a first parity region 311p and a second parity region 313p of the parity memory 200p (S520). During the memory controller 30 stores the data set DQ_BL in each of the data memories 200a~200k and stores the parity bits SPRT in the parity memory 200p, the ECC engine ECCE detects a transmission error and transmits the alert signal ALRT to the memory controller 30 when the transmission error is detected.

The memory controller 30 reads the data set DQ_BL and the first parity bits CRCd from each of the data memories 200a~200k and detects whether any of the data memories 200a~200k has an error based on the first parity bits CRCd (S530). When an error is detected in at least one of the data memories 200a~200k, the memory controller 30 determines the type of error based on the data set of a data memory in which the error is detected and the parity bits SPRT read from the parity memory 200p (S540). The memory controller 30 inverts the data set DQ_BL of the data memory in which the error is detected based on the determination (S550).

Figure 19:
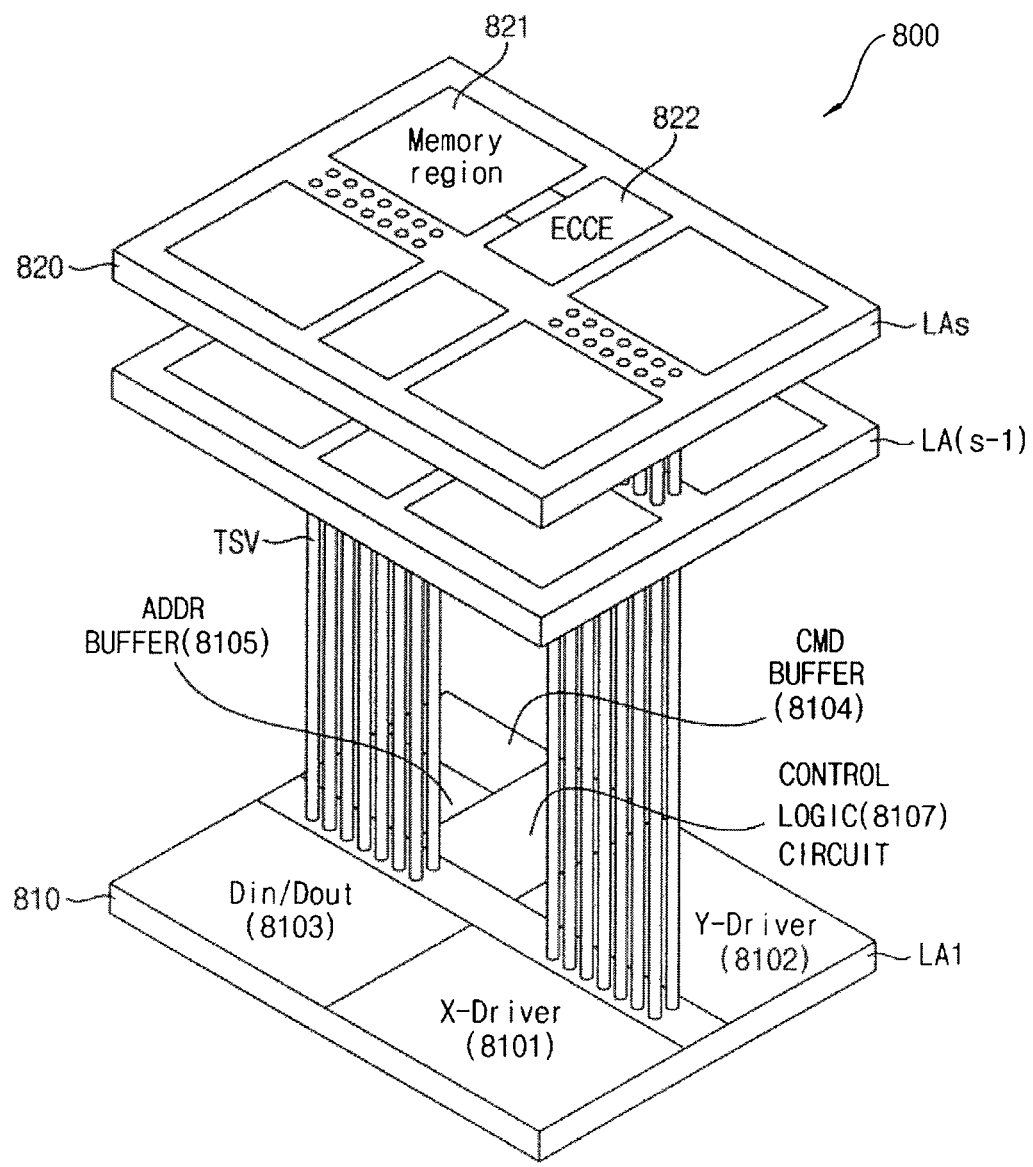
FIG. 19 illustrates an embodiment of a memory device.

FIG. 19 illustrates an embodiment of a memory device 800 which may include first through s-th semiconductor integrated circuit layers LA1 through LAs (s is a natural number greater than two). The lowest first semiconductor integrated circuit layer LA1 may be an interface or control chip. One or more other semiconductor integrated circuit layers LA2 through LAs may be slave chips including core memory chips.

The first through s-th semiconductor integrated circuit layers LA1 through LAs may transmit and receive signals therebetween through through-silicon-vias (TSVs). The lowest first semiconductor integrated circuit layer LA1, operating as an interface or control chip, may communicate with an external memory controller through a conductive structure on an external surface. (The structure and operation of the memory device 800 may be described using the first semiconductor integrated circuit layer LA1 or 810 as the interface or control chip and the s-th semiconductor integrated circuit layer LAs or 820 as the slave chip).

The first semiconductor integrated circuit layer 810 may include various peripheral circuits for driving a memory region 821 in the s-th semiconductor integrated circuit layer 820. For example, the first semiconductor integrated circuit layer 810 may include a row (X)-driver 8101 for driving word-lines of a memory, a column (Y)-driver 8102 for driving bit-lines of the memory, a data input/output unit (Din/Dout) 8103 for controlling input/output of data, a command buffer (CMD BUFFER) 8104 for receiving a command CMD from outside and buffering the command CMD, and an address buffer (ADDR BUFFER) 8105 for receiving an address from the memory controller.

The first semiconductor integrated circuit layer 810 may further include a control logic circuit 8107 to access the memory region 821 and generate control signals for accessing the memory region 821 based on commands from the memory controller.

The s-th semiconductor integrated circuit layer 820 may include the memory region 821 and an ECC engine 822 that performs ECC decoding and parity checking on data of the memory region 821. A peripheral region may include peripheral circuits such as a row decoder, a column decoder, and a bit-line sense amplifier for writing/reading data in the memory region 821.

As described with reference to FIGS. 2 to 18, the memory region 821 includes a first memory region to store data set corresponding to a plurality of burst lengths and a second data region to store first parity bits for error detection/correction, associated with the data set. The semiconductor memory device 800 may be employed as the data memory 200a or the parity memory 200p in the memory module 100 in FIG. 2.

In some embodiments, a three dimensional (3D) memory array is provided in memory device 800. The 3D memory array is monolithically formed in one or more physical levels of arrays of memory cells having an active area above a silicon substrate and circuitry associated with the operation of those memory cells, whether such associated circuitry is above or within such substrate. The term "monolithic" may correspond to layers of each level of the array that are directly deposited on the layers of each underlying level of the array.

Figure 20:
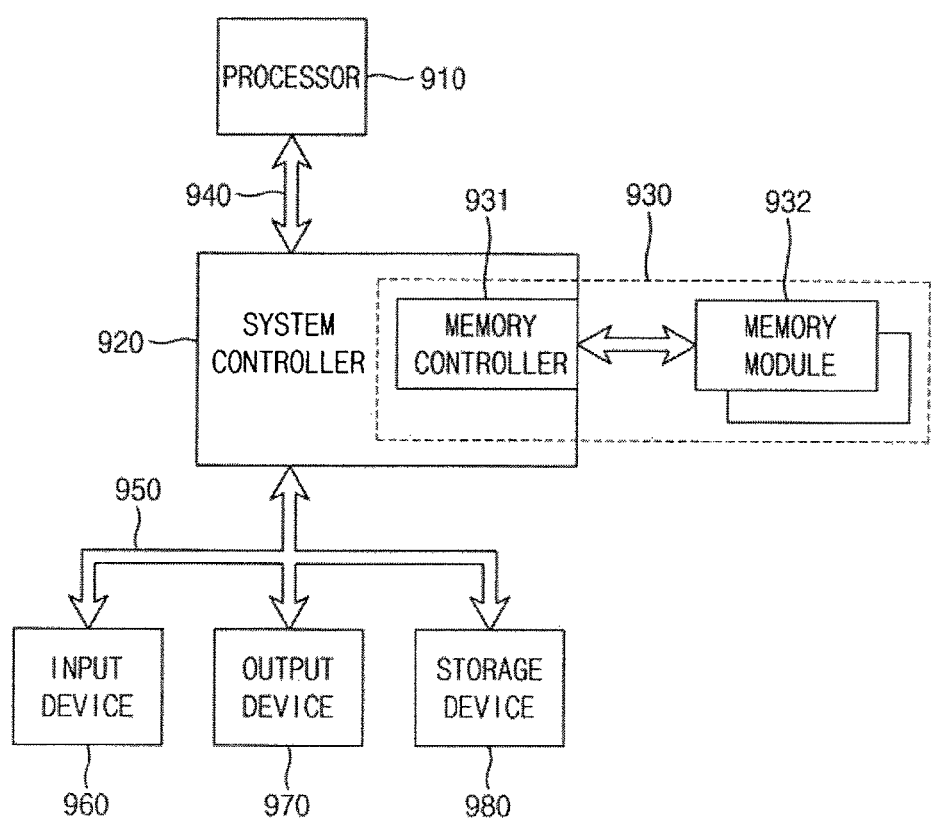
FIG. 20 illustrates an embodiment of a computing system.

FIG. 20 illustrates an embodiment of a computing system 900 including a memory device according to any of the aforementioned embodiments. Referring to FIG. 20, a computing system 900 includes a processor 910, a system controller 920 and a memory system 930. The computing system 900 may further include a processor bus 940, an extension bus 950, an input device 960, an output device 970, and a storage device 980. The memory system 930 includes at least one memory module 932, and a memory controller 931 for controlling the memory module 932. The memory controller 931 may be included in the system controller 920.

The processor 910 may perform various computing functions, such as executing specific software for performing specific calculations or tasks. The memory controller 931 may control the memory module 932 to perform a command provided form the processor 910. The memory module 932 may store data provided from the memory controller 931 and may provide the stored data to the memory controller 931. The memory module 932 may employ the memory module 100 or the memory module 100a and may provide increased reliability, availability and serviceability.

The methods, processes, and/or operations described herein may be performed by code or instructions to be executed by a computer, processor, controller, or other signal processing device. The computer, processor, controller, or other signal processing device may be those described herein or one in addition to the elements described herein. Because the algorithms that form the basis of the methods (or operations of the computer, processor, controller, or other signal processing device) are described in detail, the code or instructions for implementing the operations of the method embodiments may transform the computer, processor, controller, or other signal processing device into a special-purpose processor for performing the methods herein.

The controllers, processors, generators, and other signal generating and signal processing features of the embodiments disclosed herein may be implemented in logic which, for example, may include hardware, software, or both. When implemented at least partially in hardware, the controllers, processors, generators, and other signal generating and signal processing features may be, for example, any one of a variety of integrated circuits including but not limited to an application-specific integrated circuit, a field-programmable gate array, a combination of logic gates, a system-on-chip, a microprocessor, or another type of processing or control circuit.

When implemented in at least partially in software, the controllers, processors, generators, and other signal generating and signal processing features may include, for example, a memory or other storage device for storing code or instructions to be executed, for example, by a computer, processor, microprocessor, controller, or other signal processing device. The computer, processor, microprocessor, controller, or other signal processing device may be those described herein or one in addition to the elements described herein. Because the algorithms that form the basis of the methods (or operations of the computer, processor, microprocessor, controller, or other signal processing device) are described in detail, the code or instructions for implementing the operations of the method embodiments may transform the computer, processor, controller, or other signal processing device into a special-purpose processor for performing the methods described herein.

In accordance with one or more of the aforementioned embodiments, a memory module and memory system may implement a chip-kill technique by storing first parity bits in each of the data memories and storing the parity bits associated with all of the data set. As a result, increased reliability, availability and serviceability may be achieved without a lockstep configuration for an increased number of data memories.

The present embodiments may be applied to systems using memory modules. Examples of these systems include but are not limited to a mobile phone, a smart phone, a personal digital assistant (PDA), a portable multimedia player (PMP), a digital camera, a camcorder, personal computer (PC), a server computer, a workstation, a laptop computer, a digital TV, a set-top box, a portable game console, a navigation system, etc.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise indicated. Accordingly, various changes in form and details may be made without departing from the spirit and scope of the embodiments set forth in the claims.

What is claimed is:

1. A memory module, comprising:
    a plurality of data memories to store a user data including a plurality of data sets, each data set corresponding to a plurality of burst lengths; and
    at least one parity memory to store a plurality of parity bits being generated based on the user data, wherein:
    each of the plurality of data memories includes a first memory cell array that includes a first memory region to store each data set and a second memory region to store first parity bits for performing first error detection/correction of each data set,
    the at least one parity memory includes a second memory cell array that includes a first parity region to store the plurality of parity bits for performing second error detection/correction of the user data and a second parity region to store second parity bits for performing third error detection/correction of the plurality of parity bits.

2. The memory module as claimed in claim 1, wherein:
    the first parity bits are to detect an error in one or more of the plurality of data memories, and
    the parity bits are to correct the error detected in the one or more of the plurality of data memories.

3. The memory module as claimed in claim 2, wherein the error in the one or more plurality of data memories is:
    a transmission error which occurs while each data set is transmitted to each of the plurality of data memories, or
    a storage error which occurs while each data set is stored in each of the plurality of data memories.

4. The memory module as claimed in claim 1, wherein each of the plurality of data memories includes:
    a cyclic redundancy check (CRC) checker to calculate data check bits based on each data set, compare the data check bits and the first parity bits, and selectively store each data set in the first memory region based on a result of the comparison.

5. The memory module as claimed in claim 4, wherein the CRC checker is to:
    transmit an alert signal to a memory controller when at least one of corresponding bits of the data check bits or the first parity bits are not equal based on the result of the comparison, and
    receive each data set and the first parity bits from the memory controller again.

6. The memory module as claimed in claim 1, wherein each of the plurality of data memories includes:
    an error correction code (ECC) engine that includes a cyclic redundancy check (CRC) checker, the CRC checker to calculate data check bits based on each data set, compare the data check bits and the first parity bits, and selectively store each data set in the first memory region based on a result of the comparison.

7. The memory module as claimed in claim 6, wherein the ECC engine includes:
    an ECC decoder to correct an error of a data set read from the first memory region based on the first parity bits read from the second memory region in a read operation of the plurality of data memories.

8. The memory module as claimed in claim 7, wherein the CRC checker and the ECC decoder are to use a same error correction code.

9. The memory module as claimed in claim 1, wherein:
    each of the first memory cell array and the second memory cell array includes a plurality of dynamic memory cells or a plurality of resistive type memory cells,
    each of the first memory cell array and the second memory cell array includes a three-dimensional memory cell array, and
    the memory module includes a dual in-line memory module (DIMM).

10. A memory system, comprising:
a memory module including a plurality of data memories and at least one parity memory; and
a memory controller to control the memory module, wherein:
each of the plurality of data memories includes a first memory cell array that includes a first memory region to store data set corresponding to a plurality of burst lengths and a second memory region to store first parity bits to perform error detection/correction, associated with the data set,
the at least one parity memory includes a second memory cell array that includes a first parity region to store parity bits associated with user data set corresponding to all of the data set stored in each of the plurality of data memories and a second parity region to store second parity bits for error detection/correction, associated with the parity bits, and
the memory controller includes:
a cyclic redundancy check (CRC) generator to generate the first parity bits based on each of the data set and to generate the second parity bits based on the parity bits; and
a parity generator to generate the parity bits based on the user data set.

11. The memory controller as claimed in claim 10, wherein the memory controller includes:
a CRC/parity checker to detect an error in one or more of the plurality of data memories based on the first parity bits read from each of the plurality of data memories and correct the detected error in the one or more of the plurality of data memories based on the parity bits read from the parity memory in a read operation of the plurality of data memories.

12. The memory system as claimed in claim 11, wherein the memory controller is to control data of the one or more of the plurality of data memories in which the error is detected.

13. The memory system as claimed in claim 10, wherein each of the data memories includes:
a CRC checker to calculate data check bits based on the data set, compare the data check bits and the first parity bits, and selectively store the data set in the first memory region based on a result of the comparison.

14. The memory system as claimed in claim 13, wherein the CRC checker is to:
transmit an alert signal to the memory controller when at least one of corresponding bits of the data check bits or the first parity bits are not equal based on the result of the comparison and receive the data set and the first parity bits from the memory controller again.

15. The memory system as claimed in claim 10, wherein each of the plurality of data memories includes:
an error correction code (ECC) engine that includes a CRC checker to calculate data check bits based on the data set, compare the data check bits and the first parity bits, and selectively store the data set in the first memory region based on a result of the comparison.

16. The memory system as claimed in claim 15, wherein the ECC engine includes an ECC decoder to correct an error of a data set read from the first memory region using the first parity bits read from the second memory region in a read operation of the data memory.

17. The memory system as claimed in claim 15, wherein the ECC engine is to use a single error correction (SEC) code or a single error correction/double error detection (SECDED) code.

18. A memory module, comprising:
a first data memory;
a second data memory; and
at least one parity memory, wherein:
each of the first data memory and the second data memory includes a first memory region to store a data set corresponding to a plurality of burst lengths and a second memory region to store first parity bits for the data set,
the at least one parity memory includes a first parity region to store parity bits corresponding to a user data set and a second parity region to store second parity bits for the parity bits, wherein
each of the first data memory and the second data memory includes a cyclic redundancy check (CRC) checker to calculate data check bits based on the data set, compare the data check bits and the first parity bits, and selectively store the data set in the first memory region based on the comparison.

19. The memory module as claimed in claim 18, wherein:
the first parity bits are to detect an error in one or more of the first data memory and the second data memory, and
the second parity bits are to correct the error detected in one or more of the first data memory and the second data memory.

20. The memory module as claimed in claim 19, wherein the error is:
a data transmission error, or
a storage error corresponding to storage of the data set.

21. A method for operating a memory system, which includes a memory module and a memory controller to control the memory module, the memory module including a plurality of data memories and at least one parity memory, the method comprising:
storing, by the memory controller, a data set and first parity bits associated with the data set in a first memory region and a second memory region, respectively, of each of the plurality of data memories, the data set corresponding to a plurality of burst lengths and the first parity bits to be used for error detection/correction;
storing, by the memory controller, parity bits and second parity bits associated with the parity bits, respectively, in a first parity region and a second parity region of the at least one parity memory, the parity bits corresponding to all of the data set to be stored in each of the plurality of data memories and the second parity bits to be used to perform error detection/correction;
detecting, by the memory controller, an error of one or more of the plurality of data memories based on the first parity bits read from the one or more of the plurality of data memories;
determining, by the memory controller, a type of the detected error based on the data set of the one or more of the plurality of data memories in which the error is detected and the parity bits read from the parity memory;
inverting, by the memory controller, data of the one or more of the plurality of data memories in which the error is detected;
calculating, by a cyclic redundancy check (CRC) checker of the memory controller, data check bits based on the data set;
comparing the data check bits and the first parity bits; and
detecting the error based on a result of the comparison.

* * * * *